United States Patent
Li et al.

(10) Patent No.: US 10,043,892 B2
(45) Date of Patent: Aug. 7, 2018

(54) METHOD FOR MANUFACTURING A SEMICONDUCTOR DEVICE

(71) Applicant: TAIWAN SEMICONDUCTOR MANUFACTURING CO., LTD., Hsinchu (TW)

(72) Inventors: Chia-Ying Li, Hsinchu (TW); Ming-Shiou Kuo, Taichung (TW); Wei-Ching Wu, New Taipei (TW); Zong-Han Li, Hsinchu (TW); Ching-Lun Lai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/180,973

(22) Filed: Jun. 13, 2016

(65) Prior Publication Data

US 2017/0358663 A1    Dec. 14, 2017

(51) Int. Cl.
*H01L 29/66*   (2006.01)
*H01L 21/02*   (2006.01)
*H01L 21/8238*   (2006.01)

(52) U.S. Cl.
CPC .. *H01L 29/66795* (2013.01); *H01L 21/02271* (2013.01); *H01L 21/02348* (2013.01); *H01L 21/02694* (2013.01); *H01L 21/823821* (2013.01)

(58) Field of Classification Search
CPC ......... H01L 29/66795; H01L 21/02348; H01L 21/823821; H01L 21/02694; H01L 21/02271
See application file for complete search history.

(56) References Cited

U.S. PATENT DOCUMENTS

| | | | |
|---|---|---|---|
| 2004/0075148 A1* | 4/2004 | Kumagai | H01L 21/823807 257/369 |
| 2009/0039475 A1* | 2/2009 | Shioya | C23C 16/401 257/632 |
| 2014/0042500 A1* | 2/2014 | Wann | H01L 29/41791 257/288 |
| 2015/0179501 A1* | 6/2015 | Jhaveri | H01L 21/76224 257/506 |
| 2015/0303281 A1* | 10/2015 | Fogel | H01L 29/665 257/288 |
| 2015/0340274 A1* | 11/2015 | Ryan | H01L 21/02271 438/424 |

* cited by examiner

*Primary Examiner* — Jessica Manno
*Assistant Examiner* — Mohammed R Alam
(74) *Attorney, Agent, or Firm* — McDermott Will & Emery LLP

(57) ABSTRACT

A method for manufacturing a semiconductor device is provided, including forming a fin field effect transistor (FinFET) structure on a semiconductor substrate. The Fin-FET structure includes at least one fin, and a gate electrode structure and source/drain regions on the at least one fin. A dielectric film is formed over the at least on fin. The dielectric film is irradiated with ultra violet (UV) radiation from a single UV source.

20 Claims, 19 Drawing Sheets

METHOD FOR MANUFACTURING A SEMICONDUCTOR DEVICE

TECHNICAL FIELD

The disclosure relates to a method for manufacturing a semiconductor device.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), a fin FET (FinFET) and a gate-all-around (GAA) FET. In the semiconductor device with three-dimensional structures having a high aspect ratio such as fin structures, dielectric (insulating) films have to be more uniformly formed over such three-dimensional structures. Furthermore, better film qualities have been required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to limit the scope of the present subject matter. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In addition, the order of operations/processes may be interchangeable.

Examples of devices that can benefit from one or more embodiments of the present disclosure are semiconductor devices. Such a device, for example, is a FinFET device. FinFETs are field effect transistors formed on fin structures formed over a substrate. In some embodiments, the fins are formed in an array. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will include a FinFET example to illustrate various embodiments of the present application. It is understood, however, that the application should not be limited to a particular type of device, except as specifically claimed.

Figure 1:
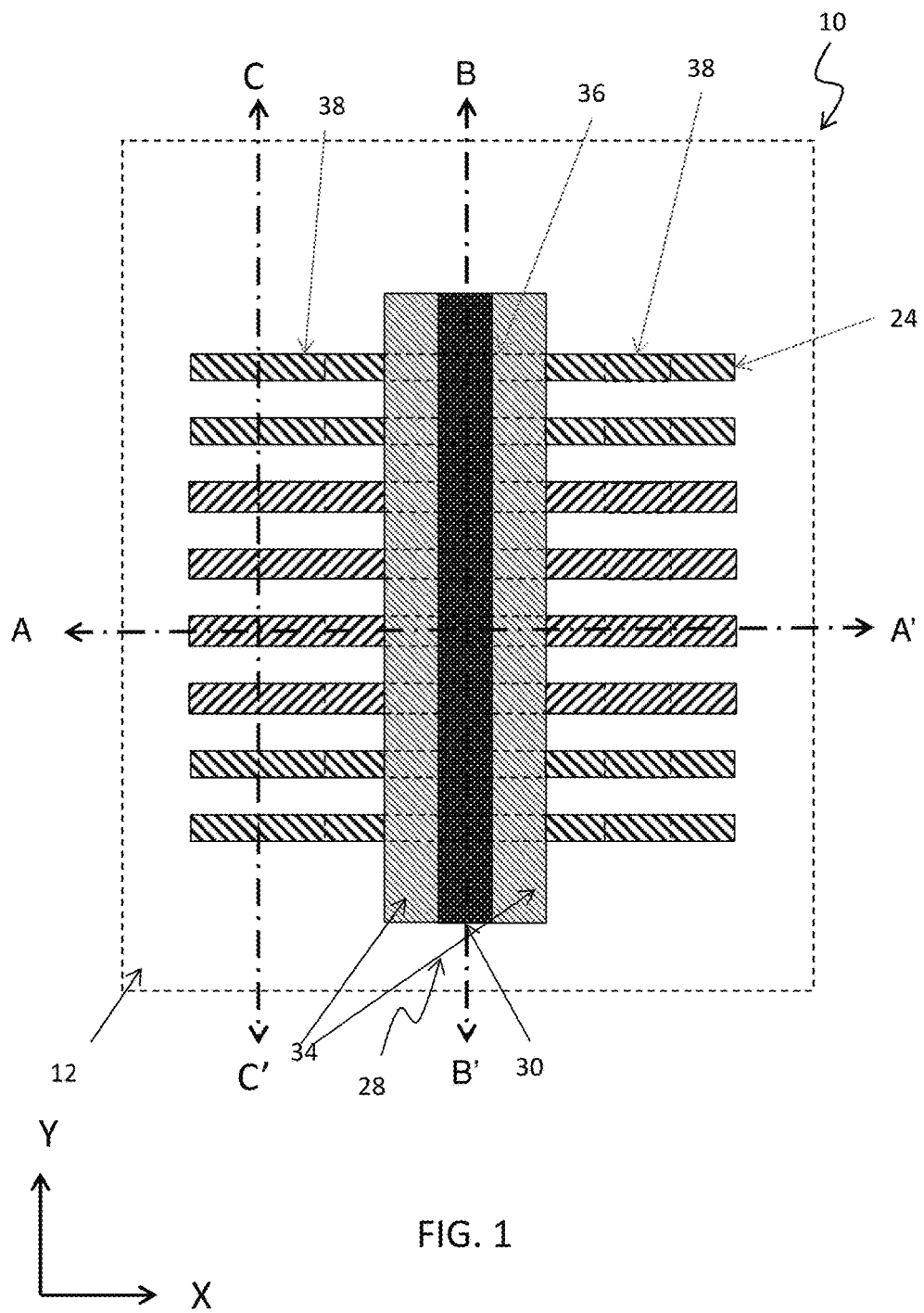
FIGS. 1-3 show a semiconductor device according to an embodiment of the present disclosure.
Figure 2:
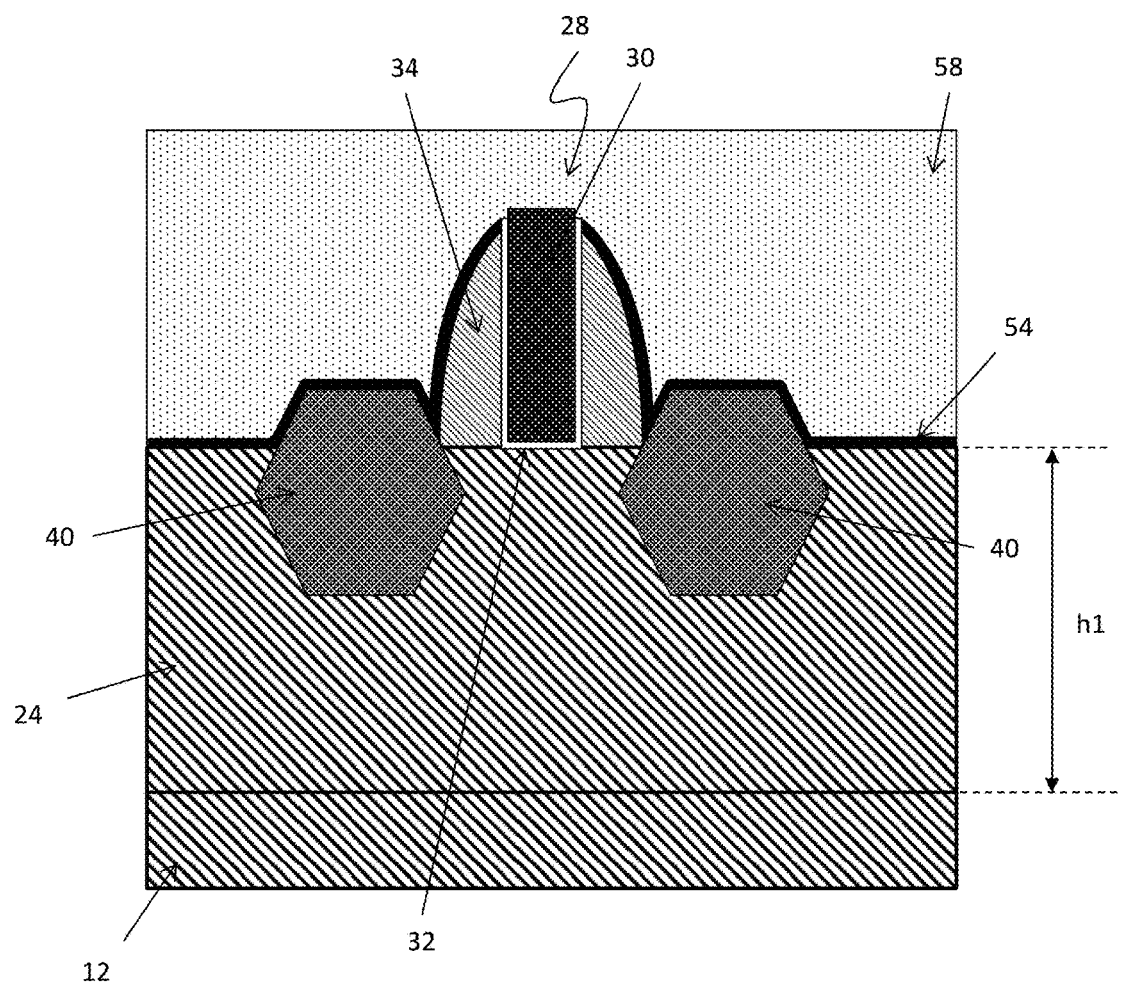
Figure 3:
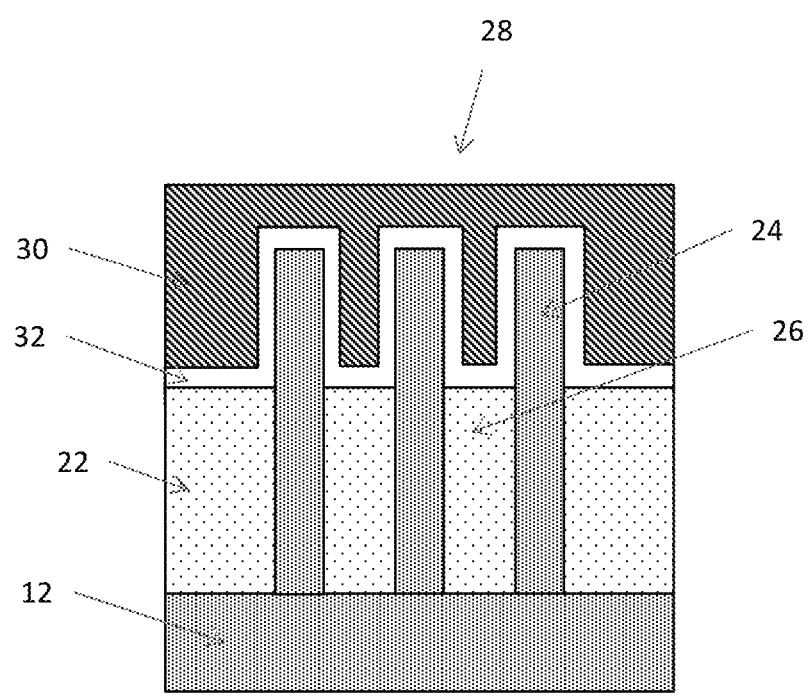

FIGS. 1-3 show a semiconductor device according to an embodiment of the present disclosure. FIG. 1 is a plan view of a FinFET structure 10 showing a gate structure 28 overlying a plurality of fins 24. FIG. 2 is a cross-sectional view along line A-A', and FIG. 3 is a cross-sectional view along line B-B'.

To fabricate a semiconductor device 10 according to an embodiment of the present disclosure one or more fins 24 are formed over a substrate 12, as illustrated in FIG. 1. The substrate 12 is, for example, a P-type silicon substrate with an impurity concentration in a range of about $1\times10^{15}$ cm$^{-3}$ to about $2\times10^{15}$ atoms cm$^{-3}$. In other embodiments, the substrate 12 is an N-type silicon substrate with an impurity concentration in a range of about $1\times10^{15}$ cm$^{-3}$ to about $2\times10^{15}$ atoms cm$^{-3}$.

Alternatively, the substrate 12 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 12 is a silicon layer of an SOI (silicon-on insulator) substrate. Amorphous substrates, such as amorphous Si or amorphous SiC, or insulating material, such as silicon oxide may also be used as the substrate 12. The substrate 12 may include various regions that have been suitably doped with impurities (e.g., P-type or N-type conductivity).

The fins 24 may be formed by patterning the semiconductor substrate 12 using photolithography and etching operations to provide a plurality of fins having a height h1 in a range of about 20 nm to about 300 nm. In certain embodiments, the height h1 is in a range of about 30 nm to about 60 nm. When the heights h1 of the fins 24 are not uniform, the height from the substrate may be measured from the plane that corresponds to the average heights of the fins 24. The width of each of the fins 24 is in a range of about 7 nm to about 15 nm.

In this embodiment, a bulk silicon wafer is used as the substrate 12. However, in some embodiments, other types of substrates may be used as the substrate 12. For example, a silicon-on-insulator (SOI) wafer may be used as a starting material, and the insulator layer of the SOI wafer constitutes the substrate 12 and the silicon layer of the SOI wafer is used for the fins 24.

As shown in FIG. 1, eight fins 24 are disposed over the substrate 12. However, the number of fins is not limited to eight. There may be as few as one fin and more than eight fins. In addition, one or more dummy fins may be disposed adjacent to the sides of the fins to improve pattern fidelity in the patterning processes. The width of each fin 24 is in a range of about 5 nm to about 40 nm in some embodiments, and in a range of about 7 nm to about 15 nm in other embodiments. The width of trenches 26 (see FIG. 3) between adjacent fins is in a range of about 5 nm to about 80 nm in some embodiments, and in a range of about 7 nm to about 15 nm in other embodiments. One skilled in the art will realize, however, that the dimensions and values recited throughout the descriptions are merely exemplary, and may be changed to suit different scales of integrated circuits.

After forming the fins 24, an isolation insulating layer 22 is formed in trenches 26 between the fins 24 and overlying the fins, so that the fins are buried in the isolation insulating layer. The isolation insulating layer 22 is also referred to as shallow trench insulation (STI). A planarization operation is performed so as to remove part of the isolation insulating layer overlying the fins. The planarization operation may include a chemical mechanical polishing (CMP) and/or an etch-back process. An upper portion of the isolation insulating layer 22 is further removed so that the channel region (upper portion) of the fins 24 is exposed, as shown in FIG. 3. To simplify the disclosure, only three fins are shown in FIG. 3. The further removal of the isolation insulating layer 22 may be performed using a dry etching process. For example, a dry etching process using CHF$_3$ or BF$_3$ as etching gases may be used.

The isolation insulating layer 22 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 22 is formed by one or more layers of SOG, SiO, SiON, SiOCN and/or fluorine-doped silicate glass (FSG) in some embodiments.

The fins 24 comprise two regions, as shown in FIG. 1, a first region 36 in a central portion of the fin 24 is where a gate structure will be formed, and a second region 38 at the peripheral portions of the fin 24 is where source/drain regions will be formed. In the present disclosure, a source and a drain are interchangeably used, and the term source/drain refers to either one of a source and a drain.

A gate structure 28 is subsequently formed over the first region 36 of the fins. The gate structure formation process may include the operations of depositing a gate dielectric 32, depositing a gate electrode 30, patterning the gate electrode, lightly doped drain (LDD) implantation, and annealing. Sidewall spacers 34 are subsequently formed on the gate structure 28, and source/drain 40 formation, implantation, and annealing are performed in subsequent operations.

The gate dielectric 32 may comprise one or more layers of silicon oxide, silicon nitride, silicon oxynitride, high-k dielectric material, other suitable dielectric material, and/or combinations thereof. The gate electrode 30 in certain embodiments is formed of polysilicon and may include a hard mask formed over the gate electrode. The hard mask may be made a suitable hard mask material, including SiO$_2$, SiN, or SiCN. In some embodiments, a thickness of the gate dielectric layer is in a range of about 5 nm to about 20 nm, and in a range of about 5 nm to about 10 nm in other embodiments. The gate electrode structure may comprise additional layers such as interfacial layers, capping layers, diffusion/barrier layers, dielectric layers, conductive layers, and other suitable layers, and combinations thereof. In addition to polysilicon, in some embodiments, the gate electrode 30 includes one or more layers of any other suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof. In some embodiments, a thickness of the gate electrode layer is in a range of about 50 nm to about 400 nm, and is in a range of about 100 nm to 200 nm in other embodiments.

In certain embodiments, the FinFET can be fabricated using a gate first method or a gate last method. In embodiments using a high-k dielectric and a metal gate (HK/MG), a gate last method is employed to form the gate electrode. In the gate last method, a dummy gate is formed, the dummy gate is subsequently removed at a later operation after a high temperature annealing operation, and the high-k dielectric and a metal gate (HK/MG) is formed.

According to embodiments of the disclosure, the high-k gate dielectric may comprise one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, AN, Ta, TaN, TaC, TaCN, TaSi, and the like.

In some embodiments, the sidewall spacers 34 are used to offset subsequently formed doped regions, such as source/drain regions 40. The sidewall spacers 34 may further be used for designing or modifying the source/drain region (junction) profile. The sidewall spacers 34 may be formed by suitable deposition and etch techniques, and may comprise one or more layers of silicon nitride, silicon oxide, silicon carbide, silicon oxynitride, other suitable materials, or combinations thereof.

A blanket layer of a sidewall insulating material may be formed by CVD, PVD, ALD, or other suitable technique. Then, an anisotropic etching is performed on the side-wall insulating material to form a pair of sidewall insulating layers (spacers) 34 on two main sides of the gate structure 28. The thickness of the sidewall insulating layers 34 is in a range of about 5 nm to about 30 nm in some embodiments, and in a range of about 10 nm to about 20 nm in other embodiments.

The second regions 38 of the fins not covered with the gate structure 28 are subsequently etched to remove the portion of the fins above the STI region 22. Suitable photolithographic and etching techniques can be used to remove the second region 38 of the fins.

In certain embodiments, raised source/drain regions 40 are subsequently formed overlying the etched portion of the fins 24 to provide a FinFET semiconductor device 10. The raised source/drain regions may be formed by one or more epitaxy or epitaxial (epi) processes, such that one or more of Si features, SiC features, SiGe features, SiP features, SiCP features, or Group III-V semiconductor material on Si EPI or other suitable features are formed in a crystalline state on the fins. The epitaxy processes include CVD deposition techniques (e.g., vapor-phase epitaxy (VPE) and/or ultra-high vacuum CVD (UHV-CVD)), molecular beam epitaxy, and/or other suitable processes.

In certain embodiments, the epitaxial growth of the source/drain regions is continued until the individual source/drain regions merge together to form a FinFET semiconductor device with merged source/drain regions.

A contact etch stop layer (CESL) 54 is subsequently formed overlying the gate region 28, and source/drain regions 40 in some embodiments, as shown in FIG. 2, prior to forming an interlayer dielectric film 58. The CESL 54 protects the source/drain regions 40 during subsequent processing. The CESL 54 comprises material with good etch selectivity between the CESL material and overlying materials. Nitrides, such as SiN or SiON, are examples of suitable CESL materials.

An interlayer dielectric film 58 (ILD) is subsequently formed over the FinFET structure 10. The ILD can be used to separate the FinFET structure from upper wiring layers. The ILD 58 can be formed by LPCVD (low pressure chemical vapor deposition), plasma-CVD or flowable CVD. In the flowable CVD (FCVD), flowable dielectric materials instead of silicon oxide are deposited over a substrate. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These precursors may be combined with gases such as $O_2$, $O_3$, $N_2$, Ar, $H_2$, He, and/or $NH_3$. Plasma-CVD may be used in the FCVD.

In some embodiments of the present disclosure, a dielectric film is formed by the FCVD using one or more source material includes at least Si, N, and O. In one embodiment of the present disclosure, the source materials include TSA, $NH_3$, Ar, and $O_2$.

Figure 4:
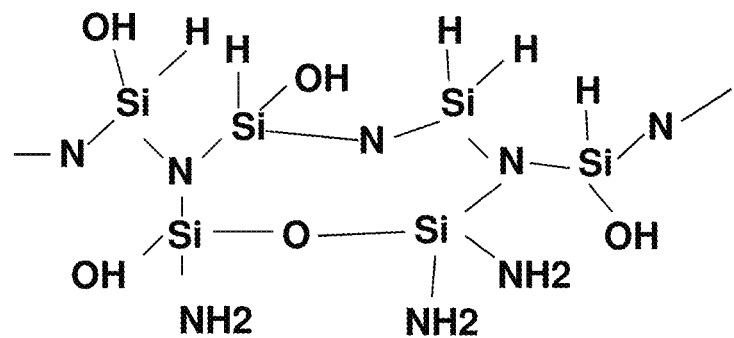
FIGS. 4 and 5 show a general concept of irradiating a dielectric film of a semiconductor device according to one embodiment of the present disclosure.

FIG. 4 shows an exemplary structure of a dielectric film, such as an interlayer dielectric film or an isolation insulating layer, as deposited on a FinFET device. As shown in FIG. 4, Si—N bonds, Si—O bonds, Si—H bonds exist in the film. In some embodiments, the amount of N and H is each 13 to 25 atomic %.

Figure 5:
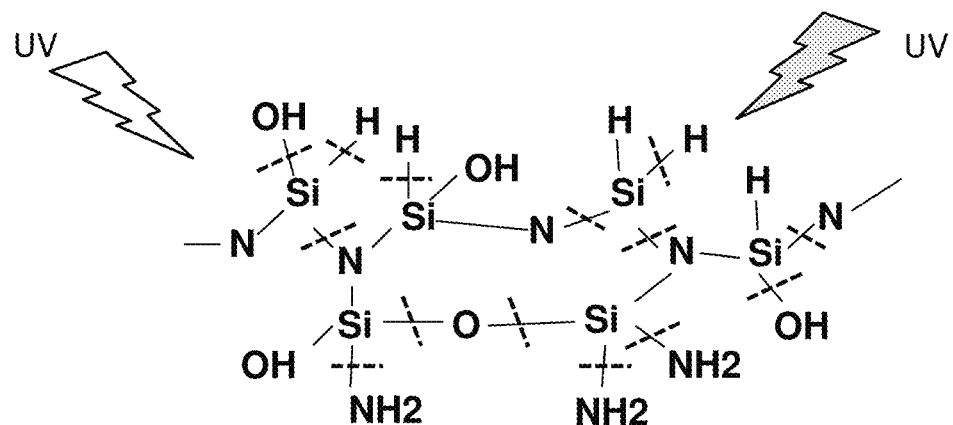

After depositing the dielectric film by FCVD, an ultra violet (UV) treatment is performed on the deposited dielectric film in some embodiments, as shown in FIG. 5. By the UV treatment, Si—X (X: O, N, H) bonds are broken to create Si dangling bonds. Some other bonds, such as N—H, N—O, O—H, are also broken by the UV treatment.

The dielectric film is subsequently annealed thereby creating more Si—O bonds in the dielectric film. During the annealing, substantially all of N and H in the dielectric film diffuse out of the dielectric film. In some embodiments, the amount of N and H remaining in the dielectric film is each more than 0 and less than 0.5 atomic %. In other words, after the annealing, the resultant dielectric film substantially consists of $SiO_2$. In some embodiments, the resultant oxide film is Si-rich oxide expressed by $Si_xO_2$, where x is more than 1 and less than 1.5.

Figure 6:
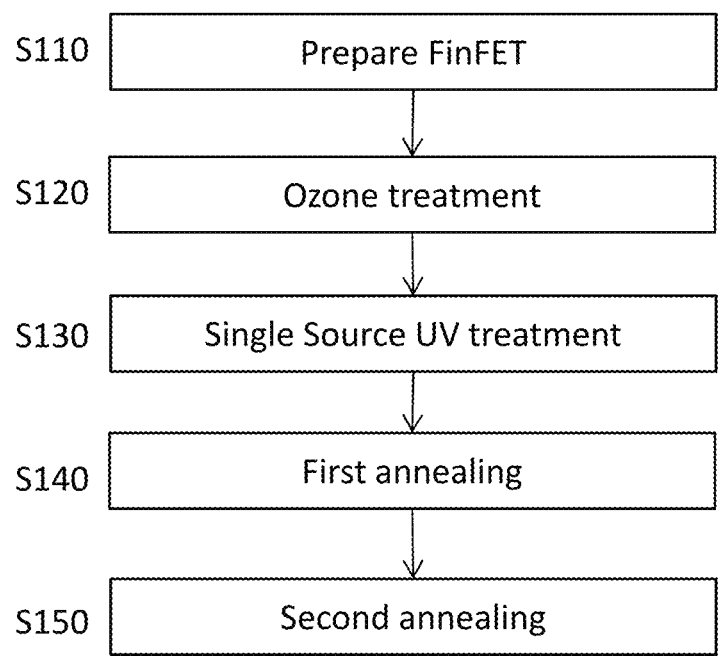
FIG. 6 shows an exemplary flow chart illustrating sequential processes for irradiating a dielectric film of a semiconductor device according to an embodiment of the present disclosure.

FIG. 6 shows an exemplary flow chart illustrating sequential processes for manufacturing a semiconductor device having a dielectric film, such as an interlayer dielectric film, according to an embodiment of the present disclosure. It is understood that additional operations can be provided before, during, and after processes shown in FIG. 6, and some of the operations described below can be replaced or eliminated. The order of the operations/processes may be interchangeable.

In S110, a FinFET structure is prepared. In certain embodiments, the FinFET structure includes an interlayer dielectric film formed over a semiconductor substrate by using FCVD. The source material in the FCVD includes at least Si, N, and O and may further include H. The source material may include dopant elements such as B and P. For example, $BF_2$ or $PH_3$ may be added to the source material in an amount such that the dielectric film includes about 0.1% to 1% of B or P.

In one embodiment, the Si source material includes trisilylamine (TSA). In some embodiments, Si source gases, such as $SiH_4$, $SiH_2Cl_2$ or $Si_2H_6$ are added. In some embodiments, NH₃ gas is further added as the nitrogen source. The source material further includes O₂ as the oxygen source and an inert gas such as Ar as a dilution gas.

The interlayer dielectric film is formed by FCVD at a temperature in a range from about 40 to about 80° C. at a pressure of about 0.1 to about 10 Torr. In some embodiments, the temperature is in a range from about 50 to about 70° C. and the pressure may be in a range from about 0.5 Torr to about 5 Torr. In some embodiments, the density of the dielectric film as deposited is in a range from about 1.3 to about 2.2 g/cm³. A wet etching rate by dilute hydrogen fluoride (DHF) of the dielectric film as deposited is equal to or more than about 12 nm/min in certain embodiments. The amount of N and H is each less than about 25 atomic %.

After forming the dielectric film, an ozone treatment may be performed on the dielectric film as deposited in S120. The ozone treatment is performed to suppress outgassing in the subsequent operations. By the ozone treatment, an upper portion of the surface of the dielectric layer is converted to a cured layer. In some embodiments, the thickness of the ozone cured layer is in a range from about 150 nm to 250 nm.

The ozone treatment is performed by heating the substrate to a temperature in a range from about 0° C. to 100° C. in some embodiments, or in a range from 100° C. to 200° C. in other embodiments. Instead of using ozone, the cured layer may be formed by using O₂, H₂O, or any oxidizing gas.

In S130, a UV treatment is performed on the dielectric film using a single UV source in some embodiments. The UV treatment is performed in a reduced pressure of about 1 Torr to about 500 Torr in some embodiments, or in a pressure of about 10 Torr to about 100 Torr in other embodiments. In some embodiments, the substrate is not heated and maintained at a room temperature (25° C.) or is cooled to 15° C. or less in other embodiments. In certain embodiments, the substrate is cooled to 10° C. or less. In other embodiments, the substrate may be heated to a temperature in a range from 50° C. to 200° C.

In the UV treatment, various UV bulbs may be used. Examples of the UV bulbs include, but are not limited to, an H bulb having main peak wavelengths at around 250 nm, 360 nm, and 430 nm; an H+ bulb having main peak wavelengths at around 250 nm, 360 nm, and 430 nm and a higher intensity in a lower wavelength of 200-280 nm than the H bulb; a D bulb having peak wavelengths in a range of 350 nm to 400 nm; a V bulb having a peak wavelength at around 420 nm; and a Q bulb having peak wavelengths at around 320 nm, 410 nm, and 450 nm. The UV bulbs are available from Heraeus and Nordson.

Figure 7:
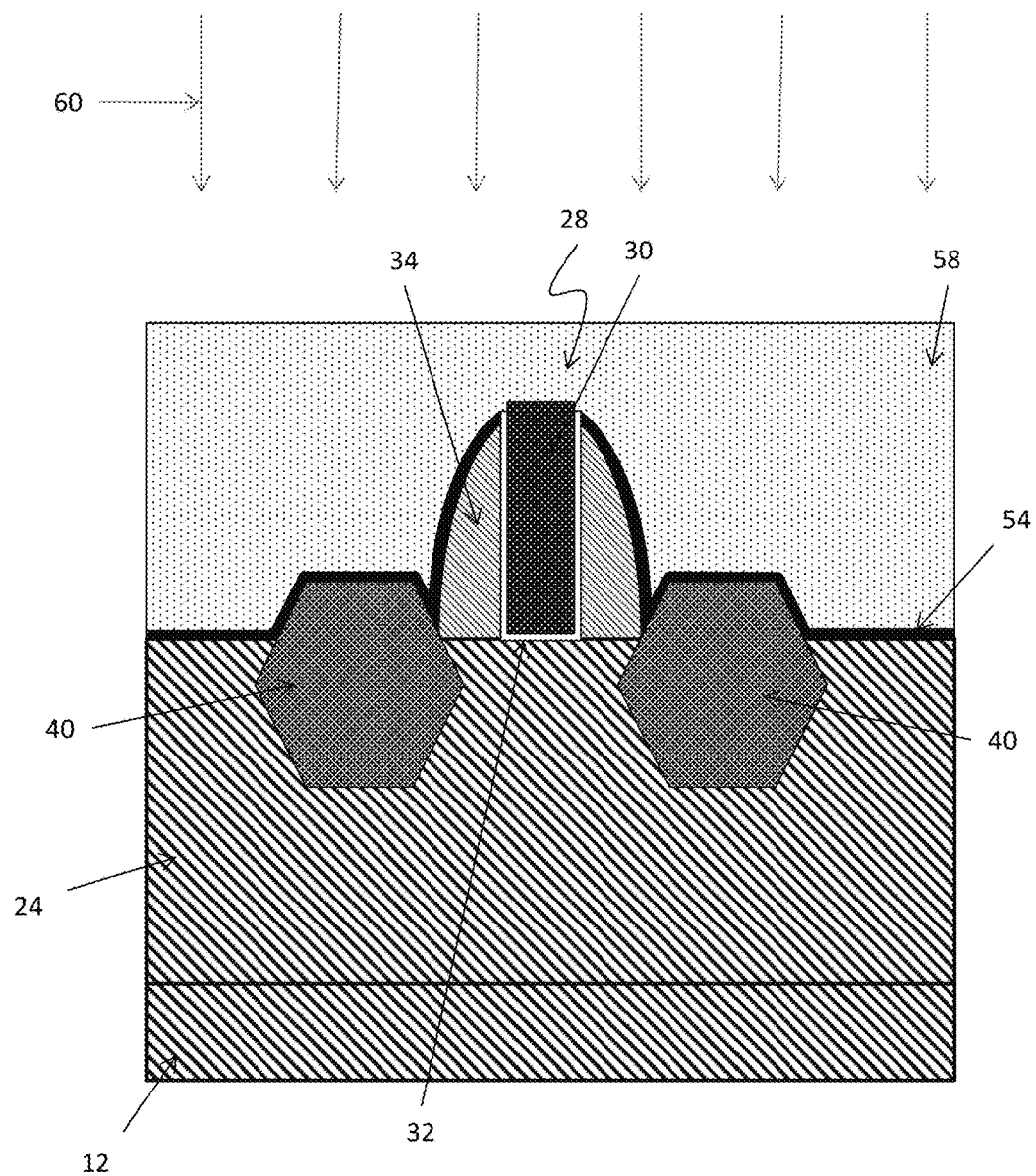
FIG. 7 shows the irradiation of a dielectric film of a semiconductor device according to an embodiment of the present disclosure.

In S130, one UV source is used to irradiate the dielectric film 58 with UV radiation 60, as shown in FIG. 7, thereby breaking Si—X bonds. The UV source can be anyone of an H bulb, H+ bulb, D bulb, V bulb, or Q bulb. In this embodiment, the dielectric film 58 is the interlayer dielectric film.

The density of the dielectric film after the UV treatment is in a range from about 1.4 to about 1.94 g/cm³ in certain embodiments.

After the UV treatment, in S140, a first annealing operation is performed by heating the substrate. In certain embodiments, the annealing operation includes three heating processes. First, the cured dielectric film is heat-treated at about 350-450° C. for about 0.5 to about 1.5 hours in an H₂O and O₂ gas ambient. Second, the dielectric film is heat-treated at about 550-650° C. for about 0.5 to about 1.5 hours in the same ambient condition. Thereafter, the dielectric film is heat-treated at about 500-1100° C. for about 0.5 to about 1.5 hours in a dry N₂ gas ambient. The first annealing operation is omitted in certain embodiments.

After the first annealing operation, a second annealing operation may be performed by heating the substrate, in S150. In certain embodiments, the annealing operation includes three heating processes. First, the cured dielectric film is heat-treated at about 200-450° C. for about 0.5 to about 1.5 hours in a H₂O and O₂ gas ambient. Second, the dielectric film is heat-treated at about 550-650° C. for about 0.5 to about 1.5 hours in the same ambient condition. Thereafter, the dielectric film is heat-treated at about 550-650° C. for about 0.5 to about 1.5 hours in a dry N₂ gas ambient. The second annealing operation is omitted in certain embodiments. A wet etching rate by dilute hydrogen fluoride (DHF) of the dielectric film that undergoes the single source UV operation and annealing operations is about 10 nm/min in certain embodiments.

Figure 8:
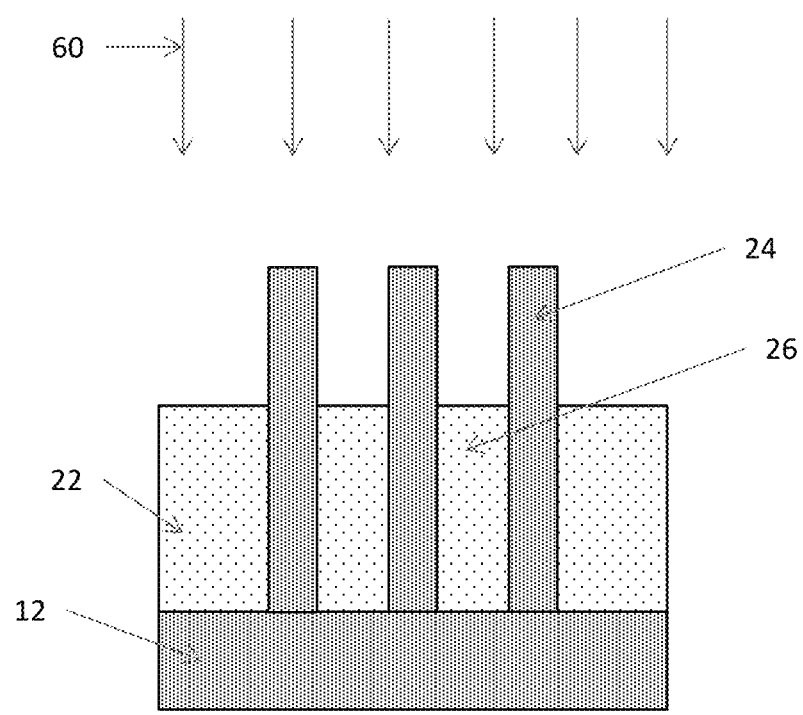
FIG. 8 shows the irradiation of a dielectric film of a semiconductor device according to an embodiment of the present disclosure.

In another embodiment of the disclosure, the irradiated dielectric film is the isolation insulating layer 22, as illustrated in FIG. 8. FIG. 8 is a cross section taken along line C-C' of FIG. 1 before the interlayer dielectric is formed. To simplify the disclosure, only three fins are shown in FIG. 8. In some embodiments, the isolation insulating layer 22 is irradiated with UV radiation rather than the interlayer dielectric film 58. In other embodiments, both the isolation insulating layer 22 and the interlayer dielectric film 58, are irradiated with UV radiation.

Figure 9:
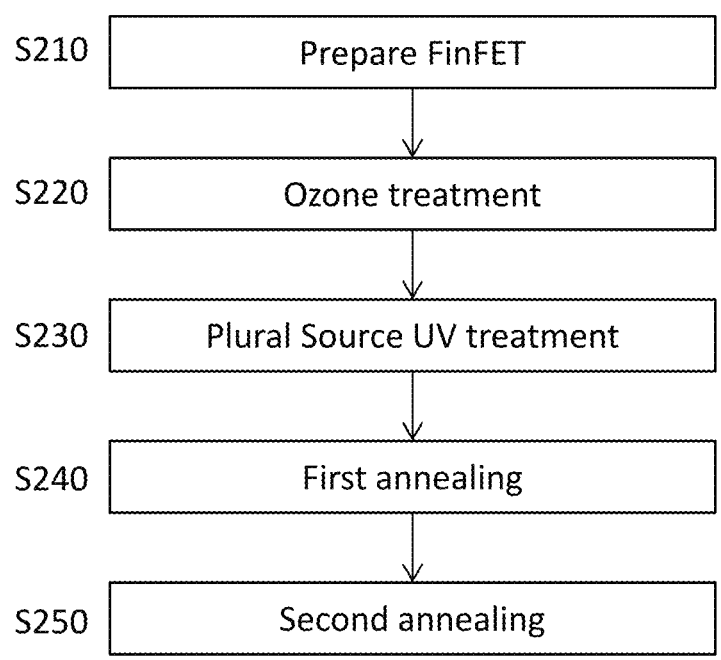
FIG. 9 shows an exemplary flow chart illustrating sequential processes for irradiating a dielectric film of a semiconductor device according to an embodiment of the present disclosure.

FIG. 9 shows an exemplary flow chart illustrating sequential processes for manufacturing a semiconductor device having a dielectric film, such as an interlayer dielectric film or an isolation insulating layer, according to an embodiment of the present disclosure. It is understood that additional operations can be provided before, during, and after processes shown in FIG. 9, and some of the operations described below can be replaced or eliminated. The order of the operations/processes may be interchangeable.

The process illustrated in FIG. 9 is similar to the process illustrated in FIG. 6, except at least two UV sources having different peak wavelengths are used to irradiate the dielectric film.

In S210, a FinFET structure is prepared in the same manner as in S110. After forming the dielectric film, an ozone treatment may be performed on the dielectric film as deposited in S220 in the same manner as in S120. After the ozone treatment, in S230, a UV treatment is performed on the dielectric film using two or more UV sources. The UV treatment is performed in a reduced pressure of about 1 Torr to about 500 Torr in some embodiments, or in a pressure of about 10 Torr to about 100 Torr in other embodiments. In some embodiments, the substrate is not heated and maintained at a room temperature (25° C.) or is cooled to 15° C. or less in other embodiments. In certain embodiments, the substrate is cooled to 10° C. or less. In other embodiments, the substrate may be heated to a temperature in a range from 50° C. to 200° C.

In the UV treatment, the two or more UV sources may be selected from various UV bulbs having different peak wavelengths. Examples of the UV bulbs include, but are not limited to, an H bulb having main peak wavelengths at around 250 nm, 360 nm, and 430 nm; an H+ bulb having main peak wavelengths at around 250 nm, 360 nm, and 430 nm and a higher intensity in a lower wavelength of 200-280 nm than the H bulb; a D bulb having peak wavelengths in a range of 350 nm to 400 nm; a V bulb having a peak wavelength at around 420 nm; and a Q bulb having peak wavelengths at around 320 nm, 410 nm, and 450 nm. For example, in one embodiment, a D bulb and an H+ bulb are used in combination.

Covalent chemical bonds can be broken by absorbing ultraviolet radiation at certain specific wavelengths, depending on the constituents bonded together. By irradiating the dielectric film with plural bulbs having different peak wavelengths, i.e., by using a variety of ranges of peak wavelengths, it is possible to more effectively break different bonds of combinations of Si, O, N, and H.

Furthermore, the use of multiple UV bulbs also affects the wet etching rate of the dielectric film. For example, if only an H+ bulb is used, a wet etching rate by DHF (e.g., 100:1) of the dielectric film after the UV treatment is about 9-11 nm/min, whereas if both a D bulb and an H+ bulb are used, the wet etching rate is about 6 to 8 nm/min.

Figure 10:
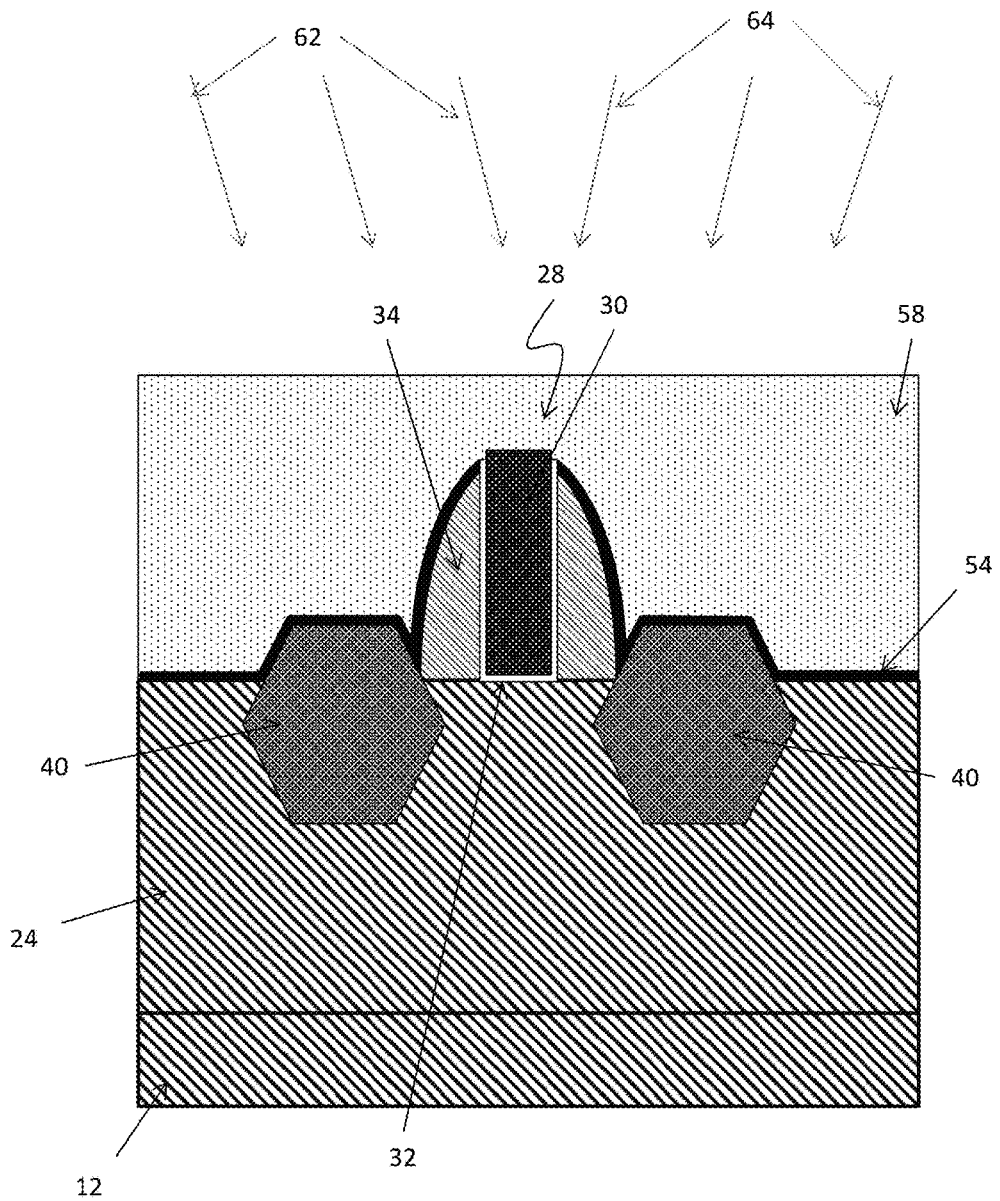
FIG. 10 shows the irradiation of a dielectric film of a semiconductor device according to an embodiment of the present disclosure.

In S230, a first UV source and a second UV source are used to irradiate the dielectric film 58 with UV radiation having first peak wavelengths 62 and UV radiation having second peak wavelengths 64, as shown in FIG. 10, thereby breaking Si—X bonds (X: O, N, H). The UV sources can be any combination of an H bulb, H+ bulb, D bulb, V bulb, or Q bulb.

The density of the dielectric film after the UV treatment is in a range from about 1.8 to about 1.94 g/cm$^3$ in certain embodiments.

In S240, a first annealing operation is performed by heating the substrate in the same manner as in S140.

A second annealing is subsequently performed on the irradiated dielectric film in S250 in the manner as described in S150.

Figure 11:
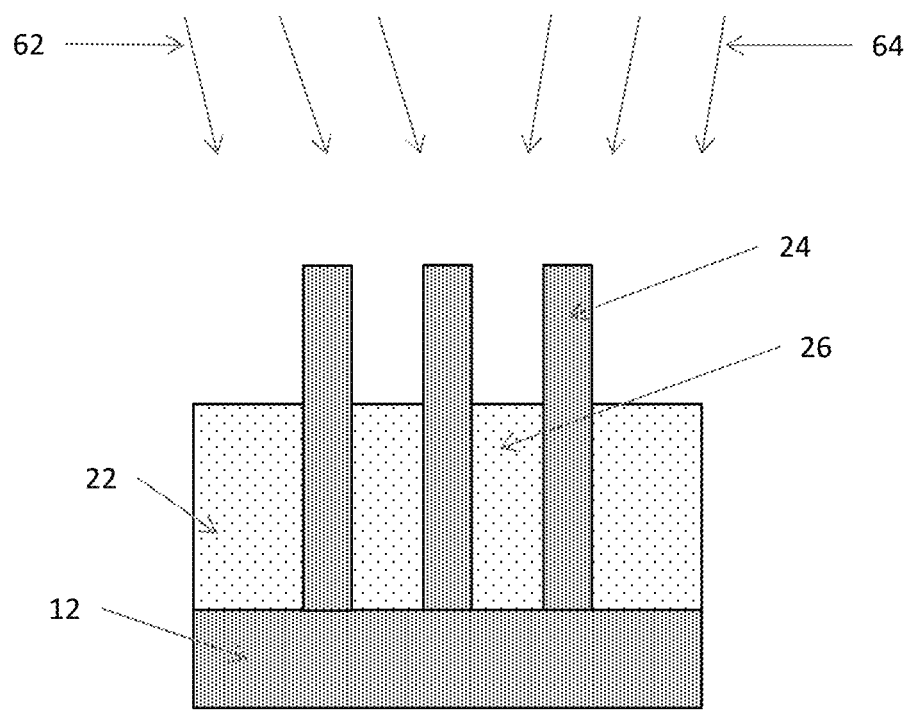
FIG. 11 shows the irradiation of a dielectric film of a semiconductor device according to an embodiment of the present disclosure.

In another embodiment of the disclosure, the irradiated dielectric film is the isolation insulating layer 22, as illustrated in FIG. 11. FIG. 11 is a cross section taken along line C-C' of FIG. 1 before the interlayer dielectric is formed. To simplify the disclosure, only three fins are shown in FIG. 11. In some embodiments, the isolation insulating layer 22 is irradiated with two different UV sources rather than the interlayer dielectric film 58. In other embodiments, both the isolation insulating layer 22 and the interlayer dielectric film 58, are irradiated with two UV sources.

Figure 12:
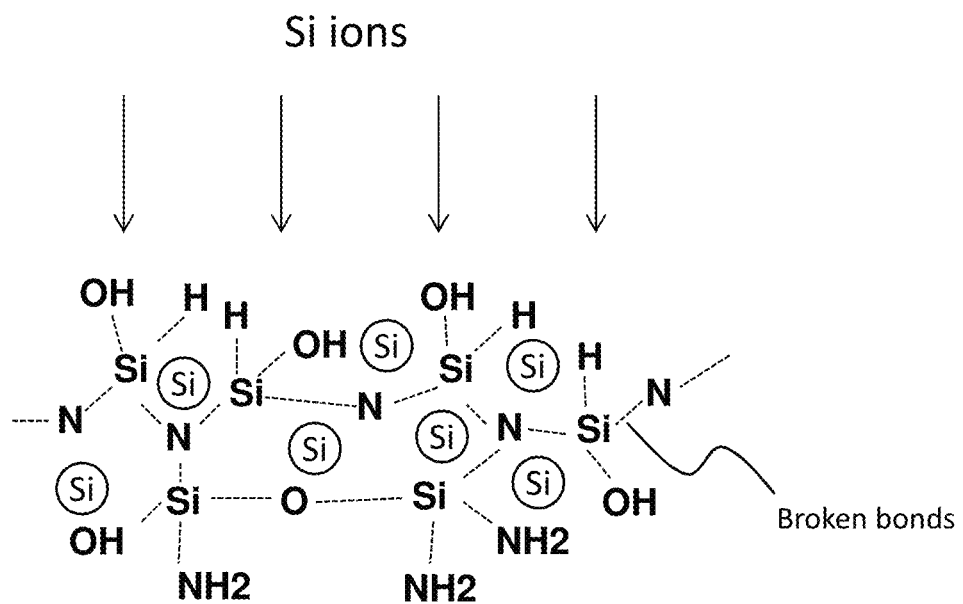
FIGS. 12 and 13 show a general concept of implanting silicon into a dielectric film of a semiconductor device according to an embodiment of the present disclosure.
Figure 13:
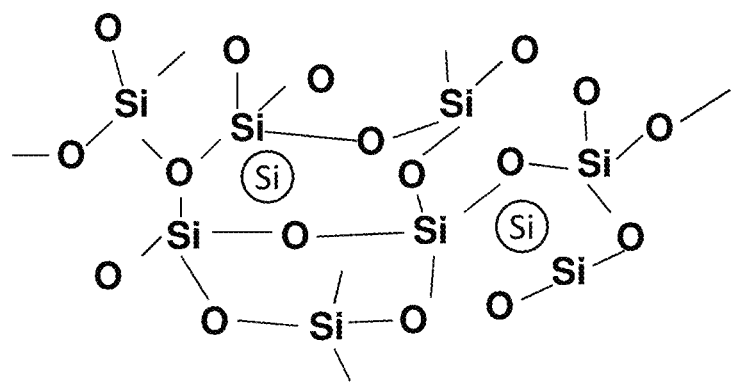

In certain embodiments of the disclosure, a dopant such as Si, B, P, He, or Ge ions, are implanted into the dielectric film formed on the FinFET structure, as shown in FIG. 12. When Si ions are implanted, the dielectric film Si—X (X: O, H, N) bonds are broken in the dielectric film and the dielectric film becomes Si rich. As shown in FIG. 13, a portion of the implanted Si ions subsequently become chemically bound to the dielectric film by reacting with the broken Si—X bonds. The dielectric film can be the interlayer dielectric film or the isolation insulating layer. For example, when Si is implanted according to the present disclosure, the dielectric film becomes substantially completely SiO$_2$. The implantation of ions into the dielectric film improves the film quality, including strengthening the film and improving the film density and hardness. Dielectric films implanted with ions can be exposed to ultra violet radiation at a lower energy dose than dielectric films that are not implanted with ions. In addition, the ion implanted dielectric films can be annealed at a lower temperature, less than 600° C. for example, instead of 1000 to 1100° C., and for a shorter time than dielectric films without implanted ions.

Figure 14A:
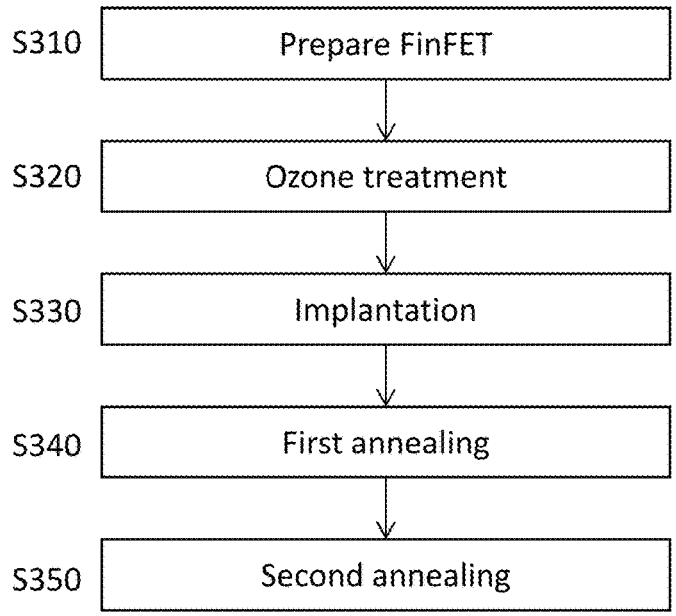
FIGS. 14A-14C show an exemplary flow chart illustrating sequential processes for implanting ions into a dielectric film of a semiconductor device according to embodiments of the present disclosure.
Figure 14B:
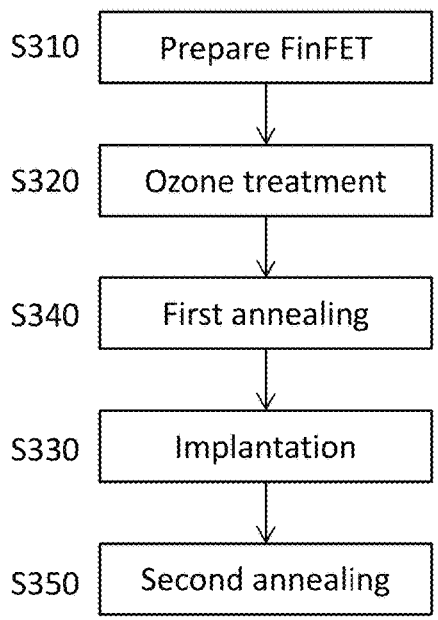
Figure 14C:
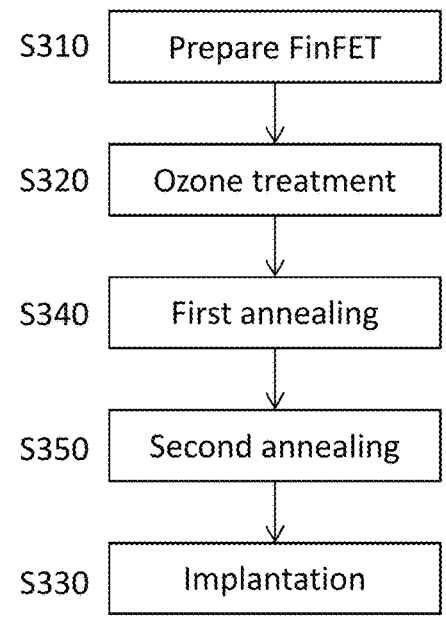

FIGS. 14A-14C show exemplary flow charts illustrating sequential processes for manufacturing a semiconductor device having a dielectric film, such as an interlayer dielectric film, according to an embodiment of the present disclosure. It is understood that additional operations can be provided before, during, and after the processes shown in FIGS. 14A-14C, and some of the operations described below can be replaced or eliminated.

In S310, a FinFET structure is prepared in the same manner as in S110. After forming the dielectric film, an ozone treatment may be performed on the dielectric film as deposited in S320 in the same manner as in S120. After the ozone treatment, in S330, ions such as B, P, Si, He and/or Ge are implanted into the dielectric film in certain embodiments of the present disclosure.

Figure 15:
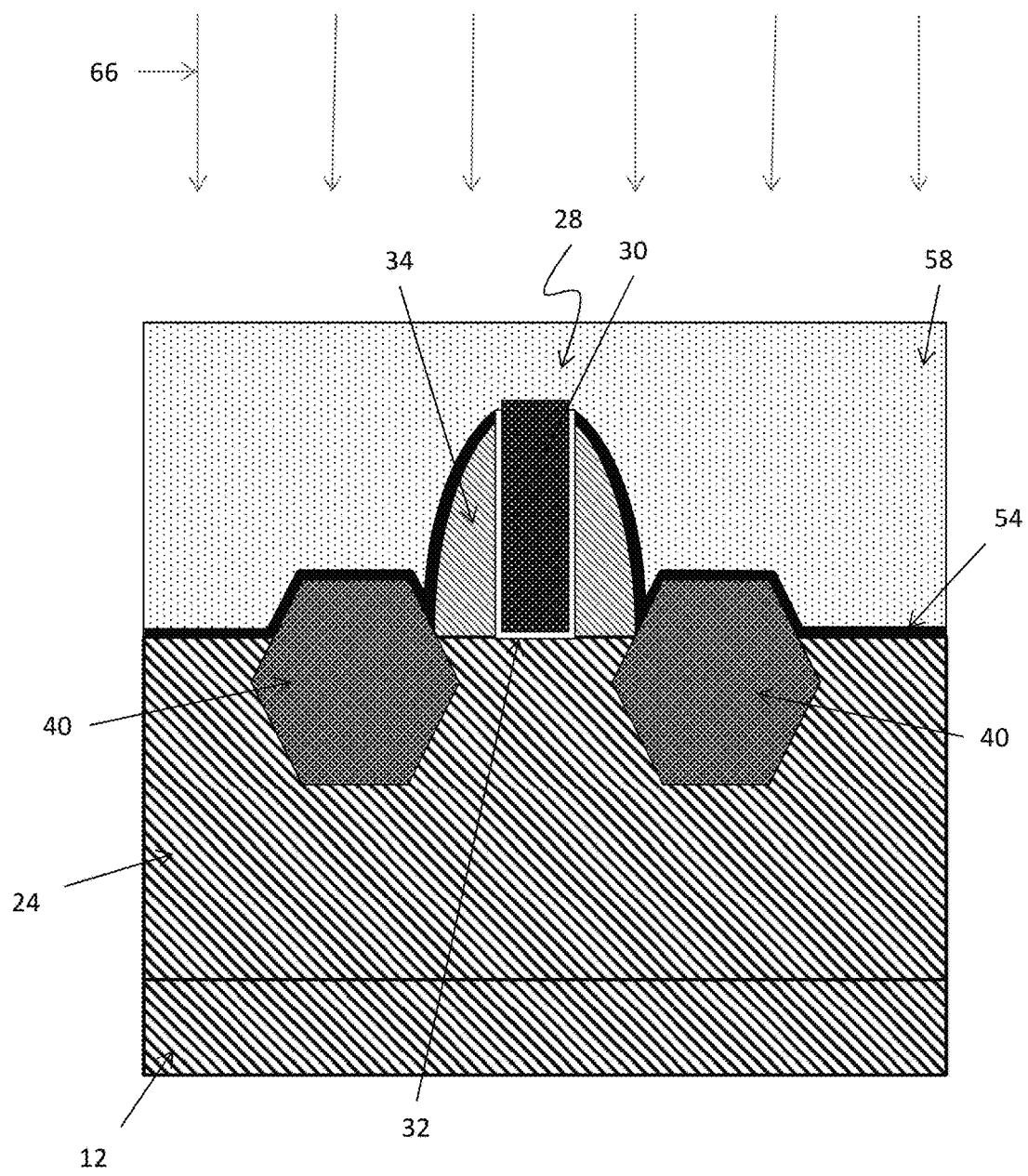
FIG. 15 shows the implantation of ions into a dielectric film of a semiconductor device according to an embodiment of the present disclosure.

In one embodiment, the ions include Si ions, and the Si ions are implanted at an energy of 0.5 KeV to 100 KeV with a dose amount of $1\times10^{14}$ to $5\times10^{16}$ cm$^{-2}$. In some embodiments, the Si ions are implanted at energy of 30 KeV to 70 KeV with a dose amount of $2\times10^{14}$ to $1\times10^{16}$ cm$^{-2}$. The implantation of the Si ions 66 into the interlayer dielectric film 58 is shown in FIG. 15.

In some embodiments, the substrate is heated to, for example, 100 to 550° C. during implantation. In other embodiments, the substrate is not heated (i.e.—maintained at room temperature).

In some embodiments, before or after implanting ions, the cured layer (a surface portion of the dielectric film) formed by the ozone treatment is removed by using, for example, dry etching, wet etching and/or chemical mechanical polishing (CMP). If the cured layer is removed before the ion implantation, it can be removed at any time between the ozone treatment and the ion implantation. If the cured layer is removed after the ion implantation, it is removed before a subsequent annealing operation.

In S340, a first annealing operation is performed by heating the substrate in the same manner as in S140.

In S350, after the first annealing, a second annealing operation is performed. The second annealing operation may include wet annealing in an H$_2$O (water vapor) and O$_2$ ambient (and optionally with inert gas such as N$_2$ or Ar), dry annealing in an N$_2$ ambient (and optionally with Ar), or a combination thereof. The temperature of the second annealing operation may be in a range from about 350° C. to about 800° C., and the time duration of the second annealing operation may be more than 1 hour. In one embodiment, the second annealing operation includes the first wet annealing at 350-450° C. for about an hour and then a second wet annealing at 550-650° C. for about an hour, followed by dry annealing at 550-1000° C. for about an hour. In certain embodiments, all the annealing operations are performed below about 600° C.

During the second annealing operation, the broken Si—X bonds are formed into Si—O bonds, and nitrogen and hydrogen contained in the dielectric film substantially diffuse out of the dielectric film, thereby forming a dielectric film substantially consisting of SiO$_2$. In some embodiments, the amount of N and H which remain in the dielectric film after the second annealing is each less than 0.5 atomic %. The density of the dielectric film after the second annealing operation is in a range from about 1.95 to about 2.4 g/cm$^3$ in some embodiments, and is in a range from 2.0 to 2.2 g/cm$^3$ in other embodiments. A wet etching rate by DHF (e.g., 100:1) of the dielectric film after the implantation and annealing operations is equal to or less than 6 nm/min.

In some embodiments, implanted atoms that are not chemically bonded to other components of the dielectric film remain in the film after the second annealing.

The order of the operations/processes may be interchangeable. For example, in some embodiments, the first annealing operation S340 is performed between the ozone treatment operation S320 and the implantation operation S330, as shown in FIG. 14B. In other embodiments, the implantation operation S330 is performed after the second annealing operation S350, as shown in FIG. 14C.

Figure 16A:
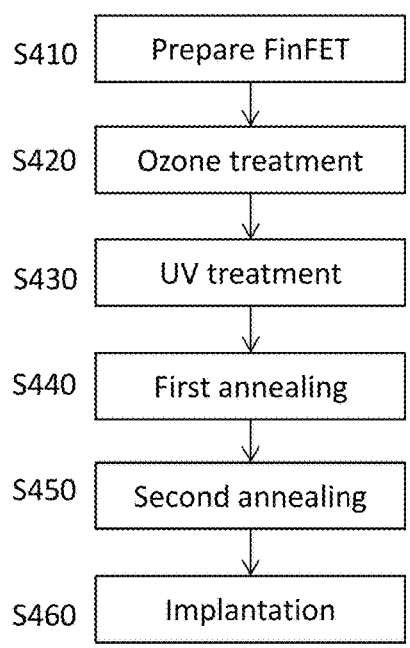
FIGS. 16A and 16B show an exemplary flow charts illustrating sequential processes for irradiating and implanting ions into a dielectric film of a semiconductor device according to embodiments of the present disclosure.
Figure 16B:
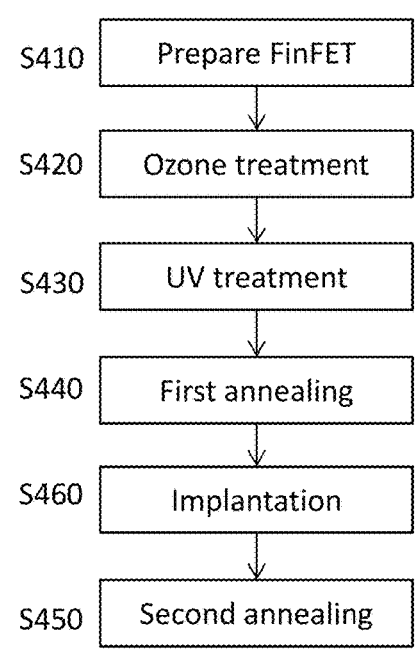

FIGS. 16A and 16B show exemplary flow charts illustrating sequential processes for manufacturing a semiconductor device having a dielectric film, such as an interlayer dielectric film or an isolation insulating layer, according to an embodiment of the present disclosure. It is understood that additional operations can be provided before, during, and after processes shown in FIGS. 16A and 16B, and some of the operations described below can be replaced or eliminated. In these sequential processes, UV irradiation and ion implantation operations are performed on the dielectric film of the FinFET structure.

Figure 17A:
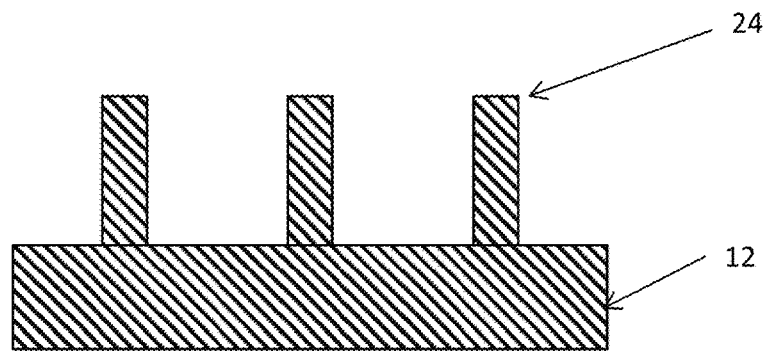
FIGS. 17A-17D show sequential processes for forming a semiconductor device and irradiating and implanting ions into a dielectric film of the semiconductor device. including
Figure 17B:
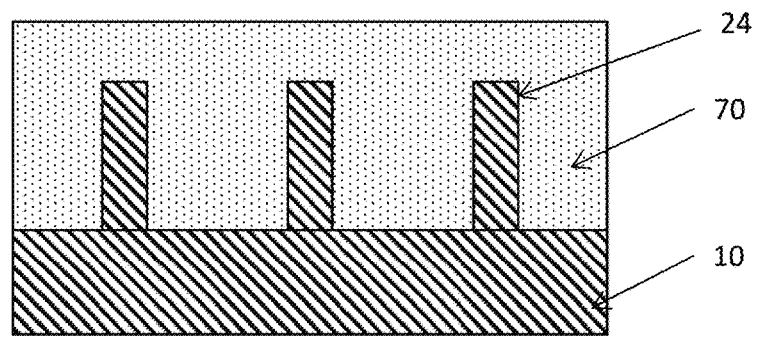
Figure 17C:
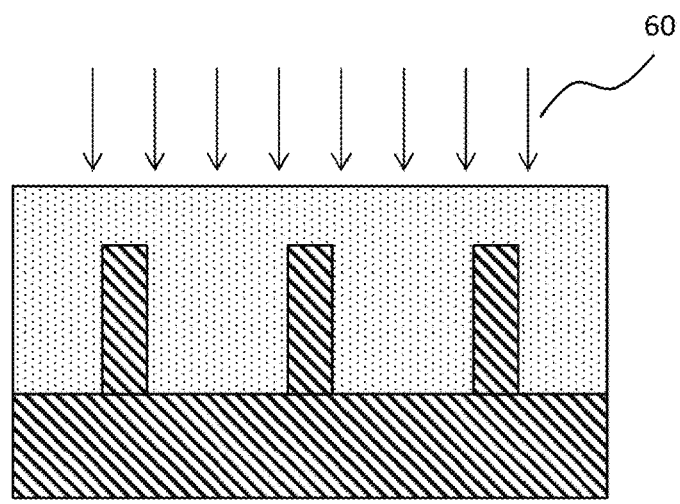
Figure 17D:
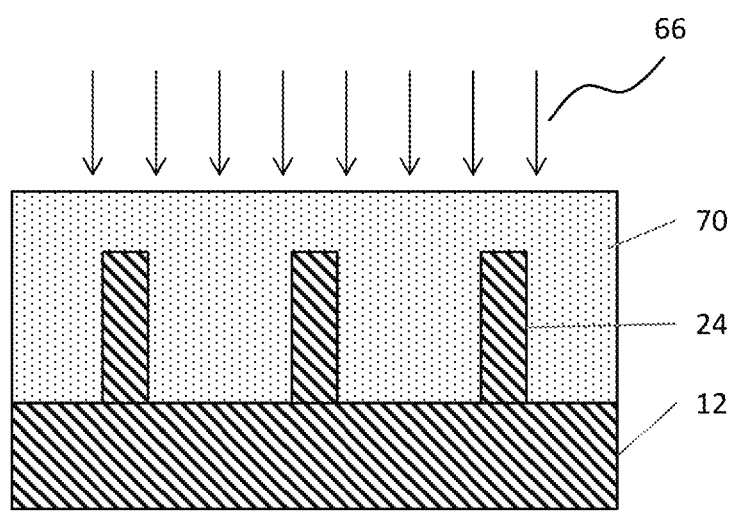

In S410, a FinFET structure is prepared in the same manner as in S110. For example, fins 24 over a semiconductor substrate 12, as shown in FIG. 17A, and a dielectric film 70 is formed over the fins 12, as shown in FIG. 17B. After forming the dielectric film 70, an ozone treatment may be performed on the dielectric film 70 as deposited in S420 in the same manner as in S120. After the ozone treatment, in S430, a UV treatment of exposing the dielectric film 70 to UV radiation 60 is performed in the same manner as in either S130 or S230 (see FIG. 17C). After the UV treatment, a first annealing operation S440 is performed by heating the substrate in the same manner as in S140. A second annealing operation S450 may be performed on the dielectric film in the same manner as in S150. In S460, ions 66 are implanted in the dielectric film 70 in the same manner as in S330 after the second annealing (see FIG. 17D).

The order of the operations/processes may be interchangeable. For example, as shown in FIG. 16B, in some embodiments, the implantation operation S460 is performed between the first annealing operation S440 and the second annealing operation S450.

In certain embodiments, a third annealing operation is performed after the implantation operation S460. The third annealing operation may include wet annealing in an $H_2O$ (water vapor) and $O_2$ ambient (and optionally with inert gas such as $N_2$ or Ar), dry annealing in an $N_2$ ambient (and optionally with Ar), or a combination thereof. The temperature of the third annealing operation may be in a range from about 350° C. to about 1000° C., and the time duration of the third annealing operation may be more than 1 hour. In one embodiment, the third annealing operation includes the first wet annealing at 350-450° C. for about an hour and then a second wet annealing at 550-650° C. for about an hour, followed by dry annealing at 550-650° C. for about an hour.

During the third annealing operation, the broken Si—X bonds are formed into Si—O bonds, and nitrogen and hydrogen contained in the dielectric film substantially diffuse out of the dielectric film, thereby forming a dielectric film substantially consisting of $SiO_2$. In some embodiments, the amount of N and H which remain in the dielectric film after the third annealing is each less than 0.5 atomic %. The density of the dielectric film after the third annealing operation is in a range from about 1.95 to about 2.4 $g/cm^3$ in some embodiments, and is in a range from 2.0 to 2.2 $g/cm^3$ in other embodiments.

In some embodiments, implanted atoms that are not chemically bonded to other components of the dielectric film remain in the film after the third annealing.

Figure 18:
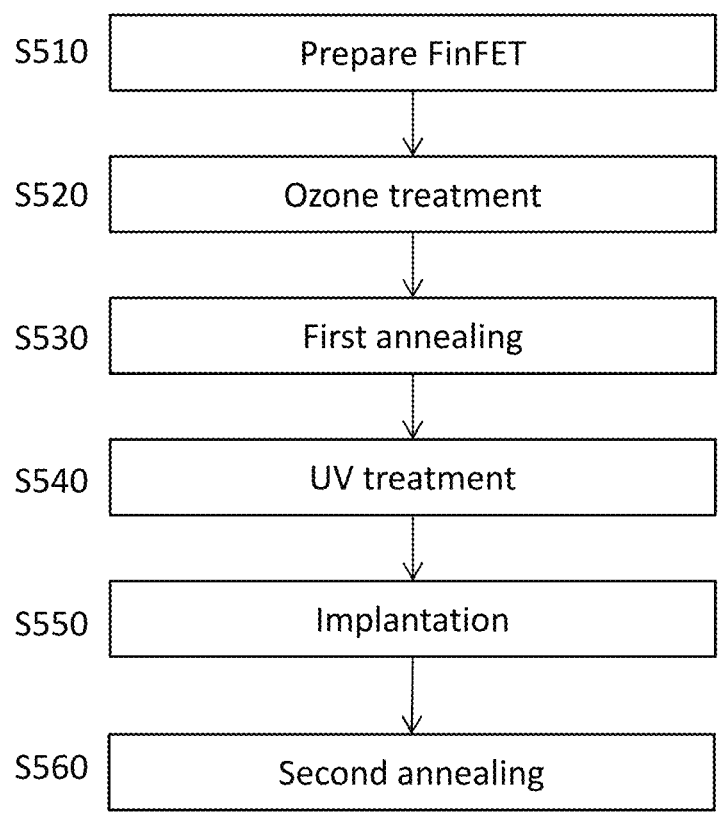
FIG. 18 shows an exemplary flow chart illustrating sequential processes for irradiating and implanting ions into a dielectric film of a semiconductor device according to an embodiment of the present disclosure.

FIG. 18 shows an exemplary flow chart illustrating sequential processes for manufacturing a semiconductor device having a dielectric film, such as an interlayer dielectric film or isolation insulating layer, according to an embodiment of the present disclosure. It is understood that additional operations can be provided before, during, and after processes shown in FIG. 18, and some of the operations described below can be replaced or eliminated. The order of the operations/processes may be interchangeable. In these sequential processes, UV irradiation and ion implantation operations are performed on the dielectric film of the FinFET structure.

In S510, a FinFET structure is prepared in the same manner as in S110. After forming the dielectric film, an ozone treatment may be performed on the dielectric film as deposited in S520 in the same manner as in S120. After the ozone treatment, in S530, a first annealing operation is performed by heating the substrate in the same manner as in S140. In S540, a UV treatment is performed on the dielectric film in the same manner as in either S130 or S230. After the UV treatment, ions are implanted into the dielectric film in S550 in the same manner as in S460. After the ion implantation a second annealing S560 is performed. The annealing steps may comprise multiple substeps, including combinations of annealing temperatures and wet and dry annealing.

FIGS. 19A-19D show exemplary flow charts illustrating sequential processes for manufacturing a semiconductor device having a dielectric film, such as an interlayer dielectric film or an isolation insulating layer, according to an embodiment of the present disclosure. The order of the operations/processes may be interchangeable. In these sequential processes, UV irradiation and/or ion implantation operations are performed on the dielectric film of the FinFET structure.

Figure 19A:
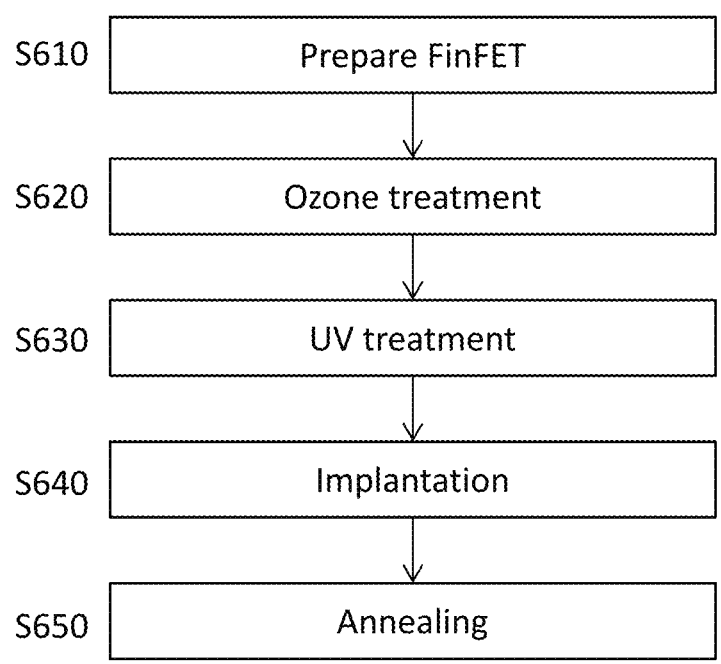
FIG. 19A-19D show exemplary flow charts illustrating sequential processes for irradiating and/or implanting ions into a dielectric film of a semiconductor device according to an embodiment of the present disclosure.

As shown in FIG. 19A, in S610, a FinFET structure is prepared in the same manner as in S110. After forming the dielectric film, in S620, an ozone treatment is performed on the dielectric film in the same manner as in S120. After the ozone treatment, a UV treatment S630 may be performed on the dielectric film in the same manner as in S130 or S230. Ions are implanted into the dielectric film in S640 in the same manner as in S460. After the ion implantation, an annealing operation S650 is performed. The annealing steps may comprise multiple substeps, including combinations of annealing temperatures and wet and dry annealing.

Figure 19B:
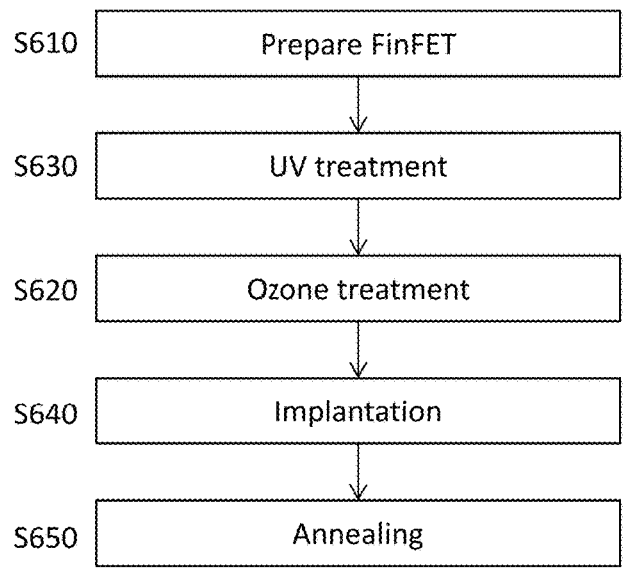
Figure 19C:
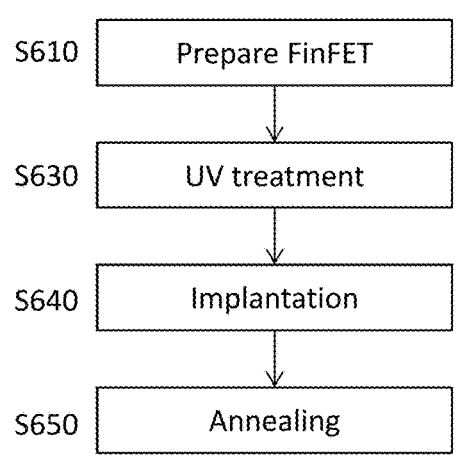
Figure 19D:
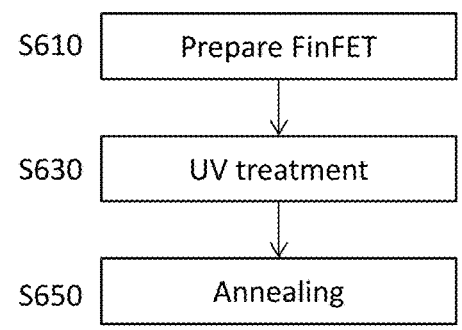

It is understood that additional operations can be provided before, during, and after processes shown in FIG. 19A, and some of the operations described can be replaced or eliminated. For example, FIG. 19B illustrates a method where the order of the UV treatment and ozone treatment are reversed, so that the UV treatment S630 is performed before the ozone treatment S620. FIG. 19C illustrates a method where the ozone treatment is eliminated, and FIG. 19D illustrates a method where ozone treatment and implantation operation are eliminated.

In certain embodiments, ions are implanted into both the interlayer dielectric film and the isolation insulating layer.

The various embodiments or examples described herein offer several advantages over the existing art. For example, in the present disclosure, by using the UV treatment and/or ion implantation, film qualities of the dielectric film used for a dielectric film, such as an ILD are improved. In particular, by introducing more Si in the dielectric film, it is possible to create a more uniform $SiO_2$ film with lower wet etching resistance It is understood that additional operations can be provided before, during, and after processes described herein, and some of the operations described above can be replaced or eliminated for additional embodiments of the method. The order of the operations/processes may be interchangeable. It is further understood that the illustrated devices undergo further CMOS processes to form various features such as interconnect metal layers, dielectric layers, passivation layers, etc.

For example, in some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In some embodiments, metal plugs are formed contacting the source/drain regions. In certain embodiments, tungsten is used to form tungsten plugs.

It will be understood that not all advantages have been necessarily discussed herein, no particular advantage is required for all embodiments or examples, and other embodiments or examples may offer different advantages.

In accordance with one aspect of the present disclosure, a method for manufacturing a semiconductor device is provided, including forming a fin field effect transistor (FinFET) structure on a semiconductor substrate. The FinFET structure includes at least one fin, and a gate electrode structure and source/drain regions on the at least one fin. A dielectric film is formed over the at least one fin. The dielectric film is irradiated with ultra violet (UV) radiation from a single UV source.

In accordance with another aspect of the present disclosure, a method for manufacturing a semiconductor device is provided, including forming a fin field effect transistor (FinFET) structure on a semiconductor substrate. The FinFET structure includes at least one fin, and a gate electrode structure and source/drain regions on the at least one fin. A dielectric film is formed over the at least one fin. The dielectric film is irradiated with ultra violet (UV) radiation from two or more UV sources, wherein the UV sources have different peak wavelengths.

In accordance with another aspect of the present disclosure, a method for manufacturing a semiconductor device includes forming a fin field effect transistor (FinFET) structure on a semiconductor substrate. The FinFET structure includes at least one fin, a gate electrode structure and source/drain regions on the at least one fin, and an isolation insulating layer surrounding a portion of the at least one fin. An interlayer dielectric film is formed over the FinFET structure. A dopant is implanted into the interlayer dielectric film. The dopant is selected from the group consisting of Si, B, P, He, and Ge ions.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a fin field effect transistor (FinFET) structure on a semiconductor substrate, the FinFET structure including at least one fin, and a gate electrode structure and source/drain regions on the at least one fin, and
    forming a dielectric film over the at least one fin;
    irradiating the dielectric film with ultra violet (UV) radiation from two or more UV sources, wherein the UV sources have different peak wavelengths,
    wherein a first UV source has peak wavelengths at about 250 nm, 365 nm, and 430 nm and a second UV source has a peak wavelength in a range from about 350 nm to about 400 nm;
    implanting a dopant into the dielectric film after irradiating the dielectric film with UV radiation; and
    performing an annealing operation on the semiconductor device,
    wherein the annealing operation is performed after implanting the dopant.

2. The method of claim 1, wherein the dielectric film is formed using a flowable chemical vapor deposition (FCVD) technique.

3. The method of claim 1, further comprising treating the dielectric film with ozone before the irradiating the dielectric film.

4. The method of claim 1, wherein the dielectric film is an interlayer dielectric film formed over the FinFET structure.

5. The method of claim 1, wherein the dielectric film is an isolation insulating layer surrounding a first portion of said at least one fin, and a second portion of the at least one fin protrudes from the isolation insulating layer.

6. The method of claim 1, wherein the dopant is ions selected from the group consisting of Si, B, P, He, and Ge ions.

7. A method for manufacturing a semiconductor device, comprising:
    forming a fin field effect transistor (FinFET) structure on a semiconductor substrate, the FinFET structure including at least one fin, a gate electrode structure and source/drain regions on the at least one fin, and an isolation insulating layer surrounding a portion of the at least one fin;
    forming a dielectric film over the FinFET structure;
    irradiating the dielectric film with ultra violet (UV) radiation;
    implanting a dopant selected from the group consisting of B, Si, P, He, and Ge ions into the dielectric film after irradiating the dielectric film with UV radiation; and
    performing a first annealing operation on the semiconductor device after implanting the dopant.

8. The method according to claim 7, further comprising treating the dielectric film with ozone.

9. The method according to claim 8, wherein the ozone treatment is performed before the irradiating the dielectric film with UV radiation.

10. The method according to claim 7, further comprising performing a second annealing operation on the semiconductor device.

11. The method according to claim 7, wherein the dielectric film is formed using a flowable chemical vapor deposition (FCVD) technique.

12. The method according to claim 8, further comprising+ performing a second annealing operation after implanting the dopant, wherein the ozone treatment is performed before the irradiating the dielectric film with UV radiation, and the first annealing operation is performed after the ozone treatment.

13. A method for manufacturing a semiconductor device, comprising:

forming a fin field effect transistor (FinFET) structure on a semiconductor substrate, the FinFET structure including at least one fin, a gate electrode structure and source/drain regions on the at least one fin, and an isolation insulating layer surrounding a portion of the at least one fin;

forming a dielectric film over the FinFET structure;

treating the dielectric film with ozone;

irradiating the dielectric film with ultra violet (UV) radiation;

performing a first annealing operation on the semiconductor device after irradiating the dielectric film with UV radiation;

performing a second annealing operation after performing the first annealing operation; and implanting a dopant into the dielectric film after performing the second annealing operation, wherein the ozone treatment is performed before the irradiating the dielectric film with UV radiation.

14. The method according to claim 13, wherein the dielectric film is formed using a flowable chemical vapor deposition (FCVD) technique.

15. The method according to claim 13, wherein the dopant is selected from the group consisting of B, Si, P, He, and Ge ions.

16. The method according to claim 13, wherein the irradiating the dielectric film with UV radiation comprises irradiating the dielectric film from two or more UV sources having different peak wavelengths.

17. The method according to claim 7, wherein the irradiating the dielectric film with UV radiation comprises irradiating the dielectric film from two or more UV sources having different peak wavelengths.

18. The method according to claim 3, further comprising:
performing a first annealing operation on the semiconductor device after performing the ozone treatment.

19. The method according to claim 18, further comprising performing a second annealing operation after the first annealing operation.

20. The method according to claim 17, wherein a first UV source has peak wavelengths at about 250 nm, 365 nm, and 430 nm and a second UV source has a peak wavelength in a range from about 350 nm to about 400 nm.

* * * * *